TELEVISION TUNER

Filed May 28, 1958

INVENTORS
ROGER R. WEBSTER
FLOYD C. DUCOTE
HARRY F. COOKE
BY
James O. Dixon

TELEVISION TUNER

Filed May 28, 1958 2 Sheets-Sheet 2

*INVENTORS*
ROGER R. WEBSTER
FLOYD C. DUCOTE
HARRY F. COOKE
BY James O. Dixon

United States Patent Office 2,964,626

Patented Dec. 13, 1960

2,964,626

TELEVISION TUNER

Roger R. Webster, Dallas, Floyd C. Ducote, Richardson, and Harry F. Cooke, Dallas, Tex., assignors to Texas Instruments Incorporated, Dallas, Tex., a corporation of Delaware Filed May 28, 1958, Ser. No. 738,382

13 Claims. (Cl. 250—40)

This invention relates to high frequency tuning devices and more particularly to a transistorized television tuner for the channels of the VHF (very high frequency) band.

Previous attempts to design transistorized television tuners have met with little or no success because of the frequency limitations of transistors now available. At the present time, they are commercially available at reasonable prices transistors which will function well as frequency converters for the high VHF channels, as amplifiers at television IF frequencies, i.e. about 44 megacycles, and as oscillators at frequencies up to 257 megacycles, the high oscillator frequency for VHF channel 13. But transistors which will function as amplifiers at signal frequencies of the television channels at the upper end of the VHF band (channel 13 is from 210 to 216 megacycles) are so expensive that their use in a fully transistorized television tuner for commercial production is economically impractical. For this reason, it is desirable to omit the RF amplifier stage in transistorized tuners in order to make them competitive in price with vacuum tube tuners.

Elimination of the RF amplifier stage, however, requires that the resonant tuning circuits which are used to select the desired signal frequency must perform their operation on the incoming signal before any amplification of that signal. Prior attempts to design such a television tuner, using either transistors or vacuum tubes, have been unsuccessful because of noise problems. These problems arise because of losses in conventional lumped constant resonant tuning circuits. In such lumped constant tuning circuits, Q's of 120 are considered excellent; but at the signal frequency of channel 13, with the standard requirement of a 6 db bandwidth of 6 megacycles, a circuit element Q of 120 produces about a 7.5 db insertion loss. Such an insertion loss usually results in an intolerably low signal-to-noise ratio since this loss reduces the signal amplitude only and not the noise amplitude. However, if the circuit element Q's are as high as 300, as can be obtained using tuned parallel lines as the resonant tuning circuits, the insertion loss drops to about 2.2 db for the same frequency and bandwidth. It is apparent then that acceptable signal-to-noise ratios can be maintained without an RF amplification stage provided the tuning elements have Q's of the magnitude obtainable using parallel line resonant circuits.

Such parallel line resonant circuits are commonly used in vacuum tube television tuners for the UHF (ultra-high frequency) television bands for which signal frequencies are as high as 895 megacycles and the noise and frequency limitations of vacuum tubes are comparable to those of transistors at VHF frequencies. Tuned parallel line resonant circuits have also been used in a few vacuum tube VHF tuners, but these tuners have been more bulky and more expensive than tuners using lumped constant resonant circuits. Their greater bulkiness and expense result because of the elaborate mechanism which must be used to tune the parallel line resonant circuit over the full range of the VHF band in which the ratio of the highest frequency to the lowest frequency is 4 to 1. (For UHF channels this ratio is much smaller, being less than 2 to 1). Because of the difficulties in compensating impedance and loading changes in the parallel lines resulting from capacitive tuning where various fixed capacitors are switched into the circuit, the tuning of this type of circuit over the full VHF frequency range has, until now, been accomplished by moving a shorting bar along the lines by mechanical means in order to tune the line inductively as well as capacitively.

Thus, among other considerations, most manufacturers found it less expensive on vacuum tube tuners to use an RF amplification stage with the lossy lumped constant circuits used to tune the signals following amplification where the insertion losses do not so seriously affect the signal-to-noise ratio, rather than high Q resonant circuits and the required complicated tuning mechanisms without an RF amplification stage. Further, the general public apparently prefers step tuning (switched capacitors) to continuous tuning (as by a shorting bar mechanism) in the television sets they purchase.

The transistorized television tuner of the present invention contains no RF amplification stage, thus eliminating the necessity of incorporating an extremely expensive transistor in the circuit. Nevertheless, the performance and cost of the tuner of the present invention is held comparable to tuners now commercially available through the use of a high Q tuned parallel line resonant circuit incorporating unique input, output and mutual coupling means to compensate for changes in impedance and loading over the VHF band and thus making possible the use of inexpensive capacitive step tuning means.

One object of the present invention, therefore, is to provide a transistorized VHF television tuner which is compact in size.

Another object of the present invention is to provide a transistorized VHF television tuner using tuned parallel lines as the resonant circuit elements.

A further object of the present invention is to provide a transistorized VHF television tuner having a good signal-to-noise ratio and bandpass characteristics making it suitable for commercial use.

A still further object of the present invention is to provide a transistorized VHF television tuner which is capacitively tuned and thus particularly suitable to provide step tuning for television channel selection.

Other and further objects of the present invention and details of its organization will become more apparent from the following detailed description taken in conjunction with the accompanying drawings, in which.

Figure 1:
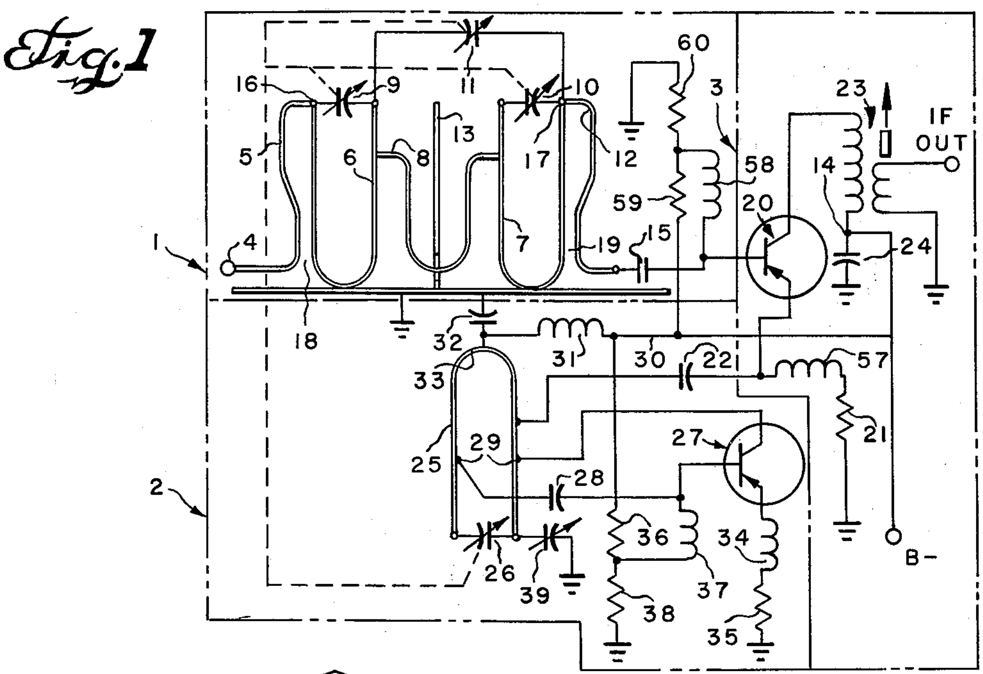
Fig. 1 is a schematic diagram of the preferred electronic circuit of the transistorized VHF television tuner of the present invention including the mixer and oscillator stages.

Referring now to Fig. 1, there is shown schematically the transistorized VHF television tuner of the present invention. The input signal tuning section is designated generally as 1, the oscillator section is designated generally as 2, and the mixer section is designated generally as 3. In the signal input tuning section 1, the incoming signal from the antenna lead-in 4 is fed to input link 5 of the tunable resonant circuit comprised of tuned parallel lines 6 and 7, mutual coupling link 8, tuning capacitors 9 and 10, coupling capacitor 11 and output link 12. The inductance of the parallel line 6 and the capacity of tuning capacitor 9 constitute the primary of a double tuned resonant circuit tunable by varying the capacity of capacitor 9. Although capacitor 9 is shown schematically as a continuously variable capacitor, it is preferably a series of fixed capacitors which may be switched into the circuit individually to select the correct value of capacitance to tune the circuit for the channel desired. The signal is fed to the secondary of the double tuned resonant circuit over the mutual coupling link 8, the ends of which are connected a short distance from the ends of the two parallel lines 6 and 7. A shield 13 is provided between the primary and secondary of the double tuned resonant circuit. The secondary of the resonant circuit is comprised of the parallel line 7 as the inductive element and capacitor 10 as the capacitive element. The secondary resonant circuit is identical in form to the primary resonant circuit with the tuning capacitor 10 shown schematically as variable to represent a series of fixed capacitors to be switched into contact between the legs of parallel line 7 for step tuning.

Ordinarily, attempts to tune such a parallel line resonant circuit over a 4:1 frequency range by capacitive tuning only would result in intolerable changes in the loading and coupling of the lines and thus unacceptable changes in the bandwidth of the entire circuit. Thus, ordinarily it is necessary to adjust the position along the line of the input tap 16 and the output tap 17 which couple the input and output links to the parallel lines. Such an adjustment would require a mechanism of the same general type which would be required to tune the lines inductively, i.e., some form of sliding contact to change the location of the shorting bar in inductive tuning or, in the present configuration a sliding contact to change the position of the input and output taps 16 and 17 along the line. In the tuner of the present invention, however, unique means have been employed to eliminate the necessity of sliding contact taps involving a larger and more complicated mechanism, and, of course, a proportional greater number of potential trouble sources. In the tuner of the present invention, the antenna coupling or input link 5 and the output coupling link 12 are each connected directly to the ends of the two parallel lines as shown. Such input and output coupling produces proper loading and thus the requisite Q and bandwidth for the lower frequency TV bands, i.e. channels 2 through 7 (54 to 88 megacycles), when the length of the parallel lines is approximately 2 inches and spacing between lines is approximately 7/16 of an inch. However, this coupling arrangement produces greater loading (lower Q) and excessive bandwidth for the higher frequency band of TV channels, i.e. channels 8 through 13 (174 to 216 megacycles), since for these channels the input and output taps should be located further from the ends of the lines to allow proper tuning of these channels. In the present invention, the input and output lines are so shaped as to be close to the parallel lines for a short distance at the lower ends of the lines. This arrangement, which is illustrated at 18 and 19 in all of the figures, produces capacitive coupling between the parallel lines and the input and output links which, at the higher frequencies where the coupling effect is greatest, effectively move the input and output taps further from the end of the two parallel lines. This capacitive coupling thus produces automatically the proper loading and coupling for proper tuning of the high frequency television channels 8 through 13.

A unique coupling system between the primary and secondary tuned circuits has also been provided since the mutual coupling between the primary and secondary also must be different for the low frequency channels and the high frequency channels to compensate for loading differences. For coupling between the tuned parallel lines at the frequencies of channels 8 through 13, the mutual coupling link 8 is effective. Each end of the link 8 is tied to one of the parallel lines a short distance from one end at the proper tap point for the frequencies involved. For proper primary to secondary coupling of the lower frequency channels, channels 2 through 7, a coupling capacitor 11 is connected between the end taps of the two parallel lines when these lower channels are selected. This coupling capacitor 11 is shown in Fig. 1 as continuously variable but preferably it is a series of fixed capacitors carried on the rotating switch which is used to switch tuning capacitors 9 and 10 and the oscillator tuning capacitor into the circuit as will be explained in connection with Fig. 2.

Continuing now with the description of the tuner illustrated in Fig. 1, the signal selected by the resonant circuit is fed to the base of the converter transistor 20 through coupling capacitor 15. Transistor 20 may be of any of several suitable high frequency transistors presently available such as, for example, Texas Instruments' type 2N623. The emitter of transistor 20 is connected to ground through RF choke 57 and bias resistor 21. The signal from the local oscillator 2 is fed to the emitter of transistor 20 through the coupling capacitor 22. The IF frequency produced in the converter is fed to the IF amplifiers of the television set through the slug tuned coupling transformer 23 which is tuned to the IF frequency. Capacitor 24 provides IF signal bypass to ground. Collector voltage (B−) is connected to the lower end of transformer 23 as illustrated at 14. Base bias voltage to converter transistor 20 is obtained by connection of the base of the transistor 20 through RF choke 58 to the voltage divider network comprised of resistors 59 and 60 connected in series between B− voltage and ground.

In the oscillator section 2, another capacitively tuned parallel line 25 is used as the resonant circuit. Line 25 is tuned by tuning capacitor 26, shown as variable but actually a series of fixed capacitors which are switched into the circuit individually along with tuning capacitors 9 and 10. The oscillator transistor 27 has its collector connected to one leg of the tuned line 25 and its base connected, through a blocking capacitor 28, to the other leg of the tuned line. These connections are made at an appropriate distance from the end of the line indicated at 29. B− voltage is applied to the collector of oscillator transistor 27 from the lead 30 through the RF choke 31 and the tuned line which is insulated from D.C. ground. Blocking capacitor 32 establishes RF ground at the shorted end 33 of the line 25. The emitter of oscillator transistor 27 is connected to ground through RF choke 34 and bias resistor 35. Base bias voltage for the oscillator transistor is established by connection of the base through RF choke 37 to a voltage divider circuit between B− and ground, as shown. This voltage divider network is comprised of resistor 36, and resistor 38. As mentioned before, the oscillator signal is fed from the collector leg of the tuned line to the emitter of mixer transistor 20 through coupling capacitor 22. Fine tuning of the tuner of the present invention is accomplished by means of the variable capacitor 39 connected between one leg of the oscillator tuned line and ground.

Figure 2:
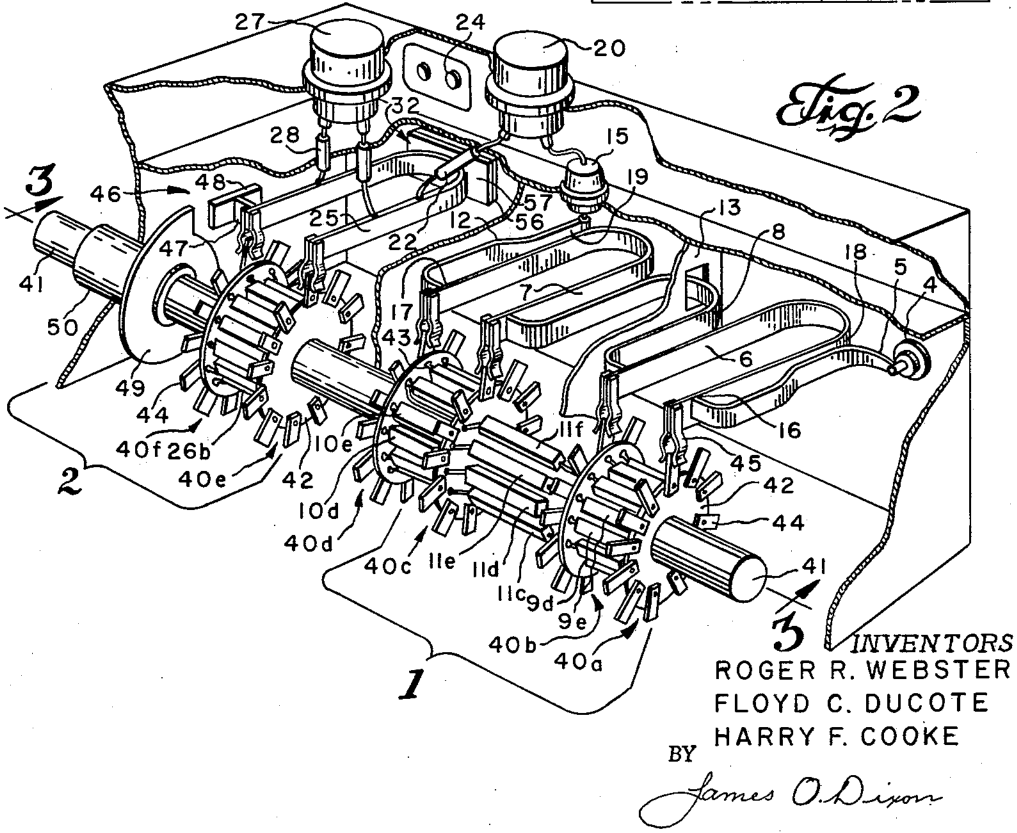
Fig. 2 is a partially cut away perspective view of the preferred physical embodiment of the present invention.
Figure 3:
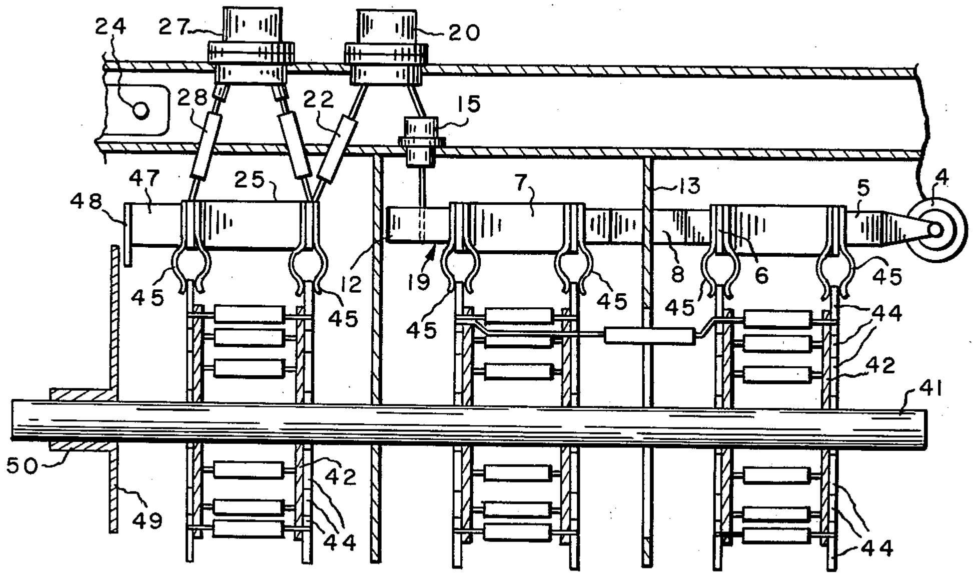
Fig. 3 is a view in section taken along line 3—3 of Fig. 2.

Turning now to Figs. 2 and 3, Fig. 2 shows a partially cut away perspective view of one physical embodiment of the present invention, and Fig. 3 shows a view in section of the embodiment taken along lines 3—3 of Fig. 2. In Figs. 2 and 3, the various parts of the tuner are identified by the same reference numbers used to identify these same parts in the schematic diagram of Fig. 1. Thus, there are shown pictorially in Figs. 2 and 3 the signal tuning section 1, the oscillator section 2 with the oscillator transistor 27, the converter transistor 20, the signal input link 5, the parallel line 6 of the primary tuned circuit, the parallel line 7 of the secondary tuned circuit, the mutual coupling link 8, the output coupling link 12, shield 13, the input and output taps 16 and 17, the sections of capacitive coupling 18 and 19 between the tuned lines and the output and input links, and the tuned parallel line 25 of the oscillator circuit. Fig. 2 further shows an arrangement for step tuning the tuner comprising a series of wafer switch elements 40*a* through 40*f*, which are mounted on and ganged controlled by the shaft 41. Each pair of wafers 40*a* and *b*, 40*c* and *d*, 40*e* and *f*, provides tuning for one of the parallel lines 6, 7 and 25. Each wafer is comprised of an insulating disc containing twelve solder terminals 43 on one side, each of which is connected to one of the projecting contacts 44 on the other side of the wafer. Fixed capacitors 9*a* through *l*, 10*a* through *l*, and 26*a* through *l* (all of which are not illustrated) are connected between the solder terminals of the wafer pairs. Each leg of each parallel line is provided with a spring contact 45. Thus it becomes obvious that all of the parallel lines 6, 7 and 25 may be ganged tuned by rotating the shaft and the wafer elements to bring the proper value of capacitor into contact with the parallel lines.

The fine tuning variable capacitor 39 in the oscillator circuit, mentioned in connection with Fig. 1 is illustrated at 46. A bus bar 47 connected to the end of one leg of the oscillator parallel line 25 terminates in a flat plate 48 lying in a plane parallel with the front panel of the tuner cover. This plate constitutes one plate of the fine tuning capacitor 39. Fine tuning is accomplished by varying the value of the capacitor through rotation of a metallic disc 49 which is in the shape of a partial spiral and is mounted on shaft 50 concentric with the main switch shaft 41. Variable tuning capacitors of this type are well known and no further explanation is believed necessary.

Several of the other circuit elements of the tuner have been illustrated in Fig. 2 such as, for example, capacitor 28, coupling capacitor 22, B— input terminal 24 and signal input terminal 4. Also shown are the six low channel coupling capacitors 11*a–f* connected between switch wafers 40*b* and 40*c*. The oscillator tuned line is insulated from D.C. ground by the plate of insulating material shown at 56. The bypass capacitor 32 comprises a metallic plate 57 attached to the line 25 and insulating plate 56 with the tuner cover acting as the grounded plate of that capacitor. It is to be realized that many of the circuit elements have been omitted from the drawings of Figs. 2 and 3 in order to more clearly illustrate the major components of the invention.

Figure 4:
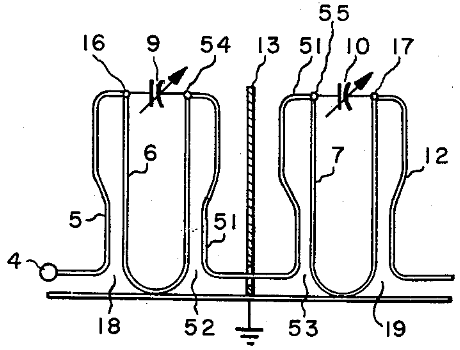
Fig. 4 illustrates an alternative form of the signal tuning section of the television tuner of the present invention.

In Fig. 4 there is illustrated in a semi-schematic manner another embodiment of the parallel lines of the signal tuning system of the present invention. This embodiment differs from that previously described in that the mutual coupling link 51 has been reshaped to be more nearly like the input and output links 5 and 12 thus to provide a capacitive coupling at the curved end of the lines 6 and 7 as illustrated at 52 and 53. It will also be noted that the connections at 54 and 55 between the mutual coupling link and the tuned lines has been moved nearer the end of the lines to provide proper balance of high channel and low channel coupling and loading. The use of such a mutual coupling link as illustrated eliminates the necessity of using a coupling capacitor (11 in Figs. 1 and 2) to achieve proper coupling between the primary and secondary lines for the low frequency channels.

Figure 5:
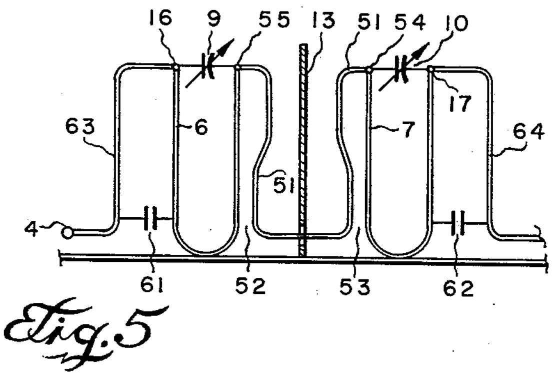
Fig. 5 illustrates still another alternative form of the signal tuning section of the television tuner of the present invention.

It is realized that space configurations in some forms of the tuner of the present invention may make it impossible to provide input and output coupling links 5 and 12 with the proper shape for the necessary capacitive coupling at 18 and 19. In these instances, this capacitive coupling may be provided by capacitors 61 and 62 inserted between the lines and the unshaped input and output links 63 and 64, as illustrated in Fig. 5.

Thus there has been described a new and novel transistorized VHF television tuner unit incorporating a unique parallel line tuning arrangement. The transistorized tuner disclosed herein displays excellent selectivity and bandpass characteristics over the entire VHF television band. The tuner has the advantage of being completely capacitively tuned and thus easily adapted to step tuning, the type preferred by most television purchasers. A further advantage of the tuner herein disclosed is the low impedance of the circuits at the IF frequencies which effectively prevents regeneration due to feedback from the collector to the base of the mixer transistor. The tuner is compact, small and simple in construction and constitutes a large step in the direction of a completely transistorized television receiver.

Although only the preferred embodiments of the present invention have been illustrated, it is to be understood that various changes and modifications still within the spirit and scope of the invention which will occur to those skilled in the art are to be construed as within the meaning of the appended claims.

What is claimed is:

1. An input signal coupling means for a parallel line resonant circuit of the type embodying an essentially U-shaped metallic strip adapted to be capacitively tuned over a broad range of frequencies comprising a metallic strip one end of which is connected to one line of said parallel line resonant circuit at its unshorted end and a capacitive coupling element between said metallic strip and said one line of said parallel line resonant circuit.

2. An input signal coupling means for a parallel line resonant circuit as defined in claim 1 wherein said capacitive coupling element is a capacitor.

3. An input signal coupling means for a parallel line resonant circuit as defined in claim 1 wherein said capacitive coupling element comprises a portion of said metallic strip lying in close proximity to and parallel with a section of said one line near its shorted end.

4. A double tuned resonant circuit for use as a television RF tuning unit comprising a pair of parallel line structures with a shield therebetween, each of said parallel line structures being a substantially U-shaped metallic strip with a capacitive tuning element connected between the open ends of said U-shaped metallic strip, a high frequency mutual coupling link comprising a substantially U-shaped metallic strip one end of which is connected to one leg of one of said parallel line structures intermediate the open end and the shorted end thereof and the other end of which is connected to one leg of the other of said parallel line structures intermediate the open end and the shorted end thereof, an adjustable capacitive low frequency coupling element connected between said one leg of said one parallel line structure and the other leg of said other parallel line structure, and input and output coupling links, said input link comprising a metallic strip one end of which is connected to the other leg of said one parallel line structure at its open end and a capacitive coupling element between said metallic strip and said other leg of said one parallel line structure, said output link comprising a second metallic strip one end of which is connected to the other leg of said other parallel line structure at its open end and a second capacitive coupling element between said second metallic strip and said other leg of said other parallel line structure.

5. A double tuned resonant circuit for use as a television RF tuning unit as defined in claim 4 wherein said capacitive coupling elements of said input and output links are capacitors.

6. A double tuned resonant circuit for use as a television RF tuning unit as defined in claim 4 wherein said capacitive coupling elements between said input link and one of said parallel line structures and between the output link and the other of said parallel line structures each comprise a portion of one of said metallic strips lying in close proximity to and parallel with a section near the shorted end of the leg of said parallel line structure to which said metallic strip is connected.

7. A double tuned resonant circuit for use as a television RF tuning unit as defined in claim 4 wherein said capacitive tuning element connected between the open ends of said substantially U-shaped metallic strip of each of said parallel line structures comprises a plurality of fixed capacitors adapted to be individually connected between said open ends by switching means.

8. In a television tuner, an RF signal tuning circuit comprising a pair of parallel line structures with a shield therebetween, each of said parallel line structures being a substantially U-shaped metallic strip with a capacitive tuning element connected between the open ends of said substantially U-shaped metallic strip, a high frequency mutual coupling link comprising a substantially U-shaped metallic strip one end of which is connected to one leg of one of said parallel line structures intermediate the open end and the shorted end thereof and the other end of which is connected to one leg of the other of said parallel line structures intermediate the open end and the shorted end thereof, an adjustable capacitive low frequency coupling element connected between said one leg of said one parallel line structure and the other leg of said other parallel line structure, and an input and an output coupling link, said input coupling link comprising a metallic strip one end of which is connected to the other leg of said one parallel line structure at its open end and a portion of which lies in close proximity to and parallel with a section of said other leg of said one parallel line structure near its curved section, the other end of said input coupling link being connected to an antenna input terminal, said output coupling link comprising a second metallic strip one end of which is connected to the other leg of said other parallel line structure at its open end and a portion of which lies in close proximity to and parallel with a section of said other leg of said other parallel line structure near its curved section, the other end of said output coupling link being connected to an output terminal coupled to a mixer circuit.

9. In a television tuner, an RF signal tuning circuit as defined in claim 8 wherein said capacitive tuning element connected between the open ends of said substantially U-shaped metallic strip of each of said parallel line structures comprises a plurality of fixed capacitors adapted to be individually connected between said open ends by switching means.

10. A double tuned resonant circuit for use as a television RF tuning unit comprising a pair of parallel line structures with a shield therebetween, each of said parallel line structures being a susbtantially U-shaped metallic strip with a capacitive tuning element connected between the open ends of said substantially U-shaped metallic strip, a mutual coupling link comprising a metallic strip one end of which is connected to one leg of one of said substantially U-shaped metallic strips at its open end and a portion of which lies in close proximity and parallel with a section of said one leg near its curved section, and the other end of which is connected to one leg of the other of said substantially U-shaped metallic strips at its open end and a portion of which lies in close proximity to and parallel with a section of said one leg of said other substantially U-shaped metallic strip near its curved section, and input and output coupling links, said input and output coupling links each comprising a metallic strip one end of which is connected to the other leg of one of said parallel line structures at its open end and a portion of which lies in close proximity to and parallel with a section of said other leg near its curved section.

11. A double tuned resonant circuit for use as a television RF tuning unit as defined in claim 10 wherein said capacitive tuning elements connected between the open ends of said substantially U-shaped metallic strip at each of said parallel line structures comprise a plurality of fixed capacitors adapted to be individually connected between said open ends by switching means.

12. In a television tuner, an RF signal tuning circuit comprising a pair of parallel line structures with a shield therebetween, each of said parallel line structures being a substantially U-shaped metallic strip with a capacitive tuning element connected between the open ends of said substantially U-shaped metallic strip, a mutual coupling link comprising a metallic strip one end of which is connected to one leg of one of said substantially U-shaped metallic strips at its open end and a portion of which lies in close proximity and parallel with a section of said one leg near its curved section, and the other end of which is connected to one leg of the other of said substantially U-shaped metallic strips at its open end and a portion of which lies in close proximity to and parallel with a section of said one leg of said other substantially U-shaped metallic strip near its curved section, and an input and an output coupling link, said input coupling link comprising a metallic strip one end of which is connected to the other leg of said one parallel line structure at its open end and a portion of which lies in close proximity to and parallel with a section of said other leg of said one parallel line structure near its curved section, the other end of said input coupling link being connected to an antenna input terminal, said output coupling link comprising a second metallic strip one end of which is connected to the other leg of said other parallel line structure at its open end and a portion of which lies in close proximity to and parallel with a section of said other leg of said other parallel line structure near its curved section, the other end of said output coupling link being connected to an output terminal coupled to a mixer circuit.

13. In a television tuner, an RF signal tuning circuit as defined in claim 12 wherein said capacitive tuning element connected between the open ends of said substantially U-shaped metallic strip of each of said parallel line structures comprises a plurality of fixed capacitors adapted to be individually connected between said open ends by switching means.

References Cited in the file of this patent

UNITED STATES PATENTS

| | | |
|---|---|---|
| 2,440,308 | Storck | Apr. 27, 1948 |
| 2,446,003 | Gardiner | July 27, 1948 |
| 2,798,206 | Baroch | July 2, 1957 |